United States Patent
Krishna et al.

(10) Patent No.: US 6,532,516 B1
(45) Date of Patent: Mar. 11, 2003

(54) TECHNIQUE FOR UPDATING A CONTENT ADDRESSABLE MEMORY

(75) Inventors: Pattabhiraman Krishna, Westborough, MA (US); Surya Kumar Kovvali, Westborough, MA (US)

(73) Assignee: Coriolis Networks, Inc., Boxborough, MA (US)

( * ) Notice: Subject to any disclaimer, the term of this patent is extended or adjusted under 35 U.S.C. 154(b) by 0 days.

(21) Appl. No.: 09/963,581

(22) Filed: Sep. 27, 2001

(51) Int. Cl.$^7$ ............................................... G06F 12/00
(52) U.S. Cl. ......................................... 711/108; 365/49
(58) Field of Search ............................ 711/108; 365/49

(56) References Cited

U.S. PATENT DOCUMENTS

| | | |
|---|---|---|
| 6,081,440 A | 6/2000 | Washburn et al. |
| 6,137,707 A | 10/2000 | Srinivasan et al. |
| 6,154,384 A | 11/2000 | Nataraj et al. |
| 6,175,514 B1 | 1/2001 | Henderson et al. |
| 6,181,592 B1 | 1/2001 | Aoki |
| 6,181,698 B1 | 1/2001 | Hariguchi |

OTHER PUBLICATIONS

A. J. McAuley et al., "Fast Routing Table Lookup Using CAMs", pp. 1–10, Infocom, 1993.

Y. Rekhter et al., "Architecture for IP Address Allocation with CIDR", Network Working Group Request for Comments: RFC 1518, Category: Standards Track, pp. 1–26, 1993 <http://www.ietf.org/rfc/rfc1518.txt?number=1518>.

J. M. Ditmar, "A Dynamically Reconfigurable FPGA–based Content Addressable Memory for IP Characterization", Master Thesis ELE/ESK/2000–3, pp. 1–87, Mar. 2000.

D. Shah et al., Department of Computer Science, "Fast incremental updates on Ternary–CAMs for routing lookups and packet classification", Hot Interconnects, 2000.

*Primary Examiner*—Kevin Verbrugge
(74) *Attorney, Agent, or Firm*—Hunton & Williams

(57) ABSTRACT

A technique for updating a content addressable memory is disclosed. In one exemplary embodiment, wherein the content addressable memory has a plurality of entries, and wherein each of the plurality of entries has a prefix field, a prefix length field, and an associated index identifier, the technique is realized by determining a first set of index identifiers, wherein each index identifier in the first set of index identifiers is associated with a respective entry in a first set of the plurality of entries, and wherein each entry in the first set of entries has a respective prefix with a respective prefix length that is greater than a third prefix length of a third prefix to be added to the content addressable memory. A second set of index identifiers is analogously determined. Based upon the first set of index identifiers and the second set of index identifiers, a third index identifier is determined. The third index identifier is associated with a third of the plurality of entries where the third prefix with the third prefix length may be added to the content addressable memory. The third index identifier is located in one of or between the first set of index identifiers and the second set of index identifiers.

37 Claims, 8 Drawing Sheets

TECHNIQUE FOR UPDATING A CONTENT ADDRESSABLE MEMORY

CROSS-REFERENCE TO RELATED APPLICATIONS

This patent application is related to U.S. patent application Ser. No. 09/963,580 filed concurrently herewith, which is hereby incorporated by reference herein in its entirety.

FIELD OF THE INVENTION

The present invention relates generally to content addressable memories and, more particularly, to a technique for updating a content addressable memory.

BACKGROUND OF THE INVENTION

The primary function of any network switch/router is to route a received packet to an appropriate destination. This primary function is made up of several different functions. For example, upon receiving the packet, the network switch/router functions to: 1.) determine the next hop node for the packet; 2.) provide buffer management for the packet; and 3.) provide quality of service to the packet. Function 1 requires a routing table lookup based primarily on a destination address field in a header of the packet. Functions 2 and 3 require classifying the packet to a "flow" based on fields in the packet header. Such fields that are typically used for packet classification include packet source and destination address fields, type of service (TOS) fields, etc.

A network processor typically performs the above-described functions. However, as link speeds and the size of the network increases, the time required for performing these functions decreases, while the size of the routing tables and the classification tables increases. For high-speed links and large networks, the network processor is not capable of performing lookups and classification at line rate.

A popular memory device used for performing fast routing table lookups and packet classification is a Content Addressable Memory (CAM). CAM's are attractive because of their inherent parallelism. A network processor builds a search key using packet header fields and sends the search key to a CAM. When a search key is presented to the CAM, a comparison of the search key happens in parallel with all of the entries in the CAM. If there are multiple matches, the CAM arbitrates among them and selects one of the entries. The network processor uses the index of the selected entry as an address to read a result from the associated memory. The result describes to the network processor the actions to be taken on the packet. Examples of such actions include replacing a field with a substitute field, decrementing a field, incrementing a field, etc.

Referring to FIG. 1A, there is shown a first example of a network switch/router 10 with a network processor (NP) 12, a CAM 14, and an associated memory 16. In the network switch/router 10 of FIG. 1A, the network processor 12 directly accesses the CAM 14 and the associated memory 16.

Referring to FIG. 1B, there is shown a second example of a network switch/router 20 with a network processor (NP) 22, a CAM 24, an associated memory 26, and a bridge device 28, which is located between the network processor 22, the CAM 24, and the associated memory 26. In the network switch/router 20 of FIG. 1B, the bridge device 28 operates to reduce the load on the network processor 22.

From a CAM perspective, both the first and second examples described above are equivalent and do not affect the internal design of the CAM.

The basic operations that are performed in a CAM are: 1.) addition of a key; 2.) deletion of a key; and 3.) search based on a key. Addition of a key occurs when a new routing entry or a flow classifier is learned by the network switch/router and has to be applied to the subsequent incoming packets (this event is also called a learning or update event). Deletion of a key could happen when a route or a flow classifier no longer exists, or when no packets with the key have arrived at the node for a long period of time (the latter event is called an aging event or a route delete event).

Referring to FIG. 2A, there is shown a 2-port CAM 30 having a search port 32 and a result port 34. In the 2-port CAM 30, CAM management (i.e., addition/deletion of keys) is multiplexed with searches through the search port 32. Thus, in the 2-port CAM 30, update latency can affect the search performance of the CAM.

Referring to FIG. 2B, there is shown a 3-port CAM 40 having a search port 42, a result port 44, and an update port 46. In the 3-port CAM 40, CAM management occurs through the update port 46. Thus, in the 3-port CAM 40, updates happen independent of searches.

While 2-port CAM's are fairly ubiquitous in the market, only a single vendor presently offers a 3-port CAM (i.e., Sibercore). However, it is anticipated that more vendors will soon begin to offer 3-port CAM's. Accordingly, because it is likely that both 2-port CAM's and 3-port CAM's will soon be widely available in the market, it would be desirable to provide a new CAM management technique to minimize the update time in both 2-port and 3-port CAM's.

SUMMARY OF THE INVENTION

According to the present invention, a technique for updating a content addressable memory is provided. In one exemplary embodiment, wherein the content addressable memory has a plurality of entries, and wherein each of the plurality of entries has a prefix field, a prefix length field, and an associated index identifier, the technique is realized by determining a first set of index identifiers, wherein each index identifier in the first set of index identifiers is associated with a respective entry in a first set of the plurality of entries, and wherein each entry in the first set of entries has a respective prefix with a respective prefix length that is greater than a third prefix length of a third prefix to be added to the content addressable memory. A second set of index identifiers is also determined, wherein each index identifier in the second set of index identifiers is associated with a respective entry in a second set of the plurality of entries, and wherein each entry in the second set of entries has a respective prefix with a respective prefix length that is less than the third prefix length of the third prefix to be added to the content addressable memory. Based upon the first set of index identifiers and the second set of index identifiers, a third index identifier is determined. The third index identifier is associated with a third of the plurality of entries where the third prefix with the third prefix length may be added to the content addressable memory. The third index identifier is located in one of or between the first set of index identifiers and the second set of index identifiers.

In accordance with other aspects of this exemplary embodiment of the present invention, each entry in the first set of entries is beneficially a member of a common prefix chain. Each entry in the second set of entries is also beneficially a member of the common prefix chain. Further, all members of the common prefix chain are beneficially sorted according to their respective prefix lengths.

In accordance with further aspects of this exemplary embodiment of the present invention, determining the first set of index identifiers beneficially comprises searching the content addressable memory for entries having prefixes with prefix lengths which match the third prefix having the third prefix length. For example, searching the content addressable memory may beneficially comprise generating a compare array having a plurality of compare array entries corresponding to the plurality of entries in the content addressable memory, wherein each of the plurality of compare array entries has a compare array prefix and an associated index identifier corresponding to the index identifier of a respective entry in the content addressable memory. Searching the content addressable memory may also beneficially comprise extending the third prefix length of the third prefix to obtain an extended third prefix with an extended third prefix length. Searching the content addressable memory may further beneficially comprise comparing the extended third prefix to the plurality of compare array prefixes so as to identify index identifiers associated with compare array prefixes which match the extended third prefix, wherein each identified index identifier corresponds to a respective entry in the content addressable memory that is a member of the common prefix chain.

In accordance with still further aspects of this exemplary embodiment of the present invention, determining the second set of index identifiers beneficially comprises searching the content addressable memory for entries having prefixes with prefix lengths which match the third prefix having the third prefix length. For example, searching the content addressable memory may beneficially comprise generating a compare array having a plurality of compare array entries corresponding to the plurality of entries in the content addressable memory, wherein each of the plurality of compare array entries has a compare array prefix and an associated index identifier corresponding to the index identifier of a respective entry in the content addressable memory. Searching the content addressable memory may also beneficially comprise extending the third prefix length of the third prefix to obtain an extended third prefix with an extended third prefix length. Searching the content addressable memory may further beneficially comprise comparing the extended third prefix to the plurality of compare array prefixes so as to identify index identifiers associated with compare array prefixes which match the extended third prefix, wherein each identified index identifier corresponds to a respective entry in the content addressable memory that is a member of the common prefix chain.

In accordance with still further aspects of this exemplary embodiment of the present invention, the third prefix with the third prefix length is beneficially added to the content addressable memory in the third entry associated with the third index identifier.

In accordance with still further aspects of this exemplary embodiment of the present invention, the plurality of entries in the content addressable memory are beneficially bounded by a minimum index identifier (INDEXMIN) and a maximum index identifier (INDEXMAX), the plurality of entries in the content addressable memory beneficially comprise a plurality of free space entries each having an unused prefix field and an unused prefix length field, the plurality of free space entries are beneficially located in a middle portion of the content addressable memory bounded by a low free space index identifier (FREELOW) and a high free space index identifier (FREEHIGH), entries in the content addressable memory having prefixes with prefix lengths that are greater than a threshold prefix length (THRESHOLD) beneficially have associated index identifiers that are greater than or equal to INDEXMIN and less than FREELOW, and entries in the content addressable memory having prefixes with prefix lengths that are less than or equal to THRESHOLD beneficially have associated index identifiers that are greater than FREEHIGH and less than INDEXMAX.

In accordance with still further aspects of this exemplary embodiment of the present invention, a subset of entries of one of the first set of entries and the second set of entries is beneficially moved up to create the third entry into which the third prefix with the third prefix length may be added if the third index identifier is determined to be less than FREELOW. If such is the case, FREELOW is beneficially incremented by one if the third index identifier is determined to be less than FREELOW.

In accordance with still further aspects of this exemplary embodiment of the present invention, a subset of entries of one of the first set of entries and the second set of entries is beneficially moved down to create the third entry into which the third prefix with the third prefix length may be added if the third index identifier is determined to be greater than FREEHIGH. If such is the case, FREEHIGH is beneficially decremented by one if the third index identifier is determined to be greater than FREEHIGH.

In accordance with still further aspects of this exemplary embodiment of the present invention, a fourth prefix with a fourth prefix length may beneficially be deleted from a fourth entry having an associated fourth index identifier. If such is the case, a free space indicator in the fourth entry may beneficially be set. Also, if such is the case, a block of entries may beneficially be moved down by one from the plurality of free space entries into the fourth entry if the fourth index identifier is less than FREELOW. Further, FREELOW may beneficially be decremented by one if the fourth index identifier is less than FREELOW. Additionally, a free space indicator in the entry associated with index identifier FREELOW−1 may beneficially be set after decrementing FREELOW by one. Alternatively, if such is the case, a block of entries may beneficially be moved up by one from the plurality of free space entries into the fourth entry if the fourth index identifier is greater than FREEHIGH. Further, FREEHIGH may beneficially be incremented by one if the fourth index identifier is greater than FREEHIGH. Additionally, a free space indicator in the entry associated with index identifier FREEHIGH+1 may beneficially be set after incrementing FREEHIGH by one.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

There are generally two different types of CAM's: a binary CAM and a ternary CAM. A binary CAM can store only one of two states (i.e., "0" or "1") in each memory bit location. In contrast, a ternary CAM (or TCAM) can store one of three states (i.e., "0", "1", or "X") in each memory bit location. A TCAM is implemented as two memory arrays: one to store table entries and another to store mask entries. A "1" in a bit location of a mask entry means that a corresponding bit location in a table entry is valid and has to be compared with a search key. A "0" in a bit location of a mask entry means that a corresponding bit location in a table entry is a "don't care" (or a wildcard) and need not be considered in the comparison process. In addition to individual mask entries, a TCAM may also utilize global masks. These global masks are applied to the search key to determine the wildcard bits and the valid bits.

The addressing scheme used by the popular internet protocol (IP) is the Classless Inter-Domain Routing (CIDR) scheme. CIDR is a replacement for the old process of assigning Class A, B, and C addresses with a generalized network "prefix". Instead of being limited to network identifiers (or "prefixes") of 8, 16, or 24 bits, CIDR could potentially use any prefix of between 0 and 32 bits for Internet Protocol, version 4 (IP v.4) addresses. However, currently most prefixes range between 13 to 27 bits. Thus, blocks of addresses can be assigned to networks as small as 32 hosts or to those with over 500,000 hosts. This allows for address assignments that much more closely fit an organization's specific needs.

A CIDR address includes the standard 32-bit IP address and also information on how many bits are used for the network prefix. For example, in the CIDR address 26.13.01.48/25, the "/25" indicates the first 25 bits are used to identify the unique network, leaving the remaining bits to identify the specific host. The length of this prefix is 25 bits.

At this point it should be noted that each segment of the CIDR address (i.e., each segment that is separated by a period) is 8 bits in length. Thus, for example, in the above CIDR address 26.13.01.48/25, the "26" segment is the decimal representation of the binary number 00011010.

The CIDR addressing scheme enables "route aggregation" in which a single high-level route entry can represent many lower-level routes in global routing tables. In order to store a CIDR entry in a TCAM, the TCAM should be able to store bits, which could be wildcards (i.e., these bits should match to a "0" or a "1" in the same bit location in the search key).

Figure 1B:
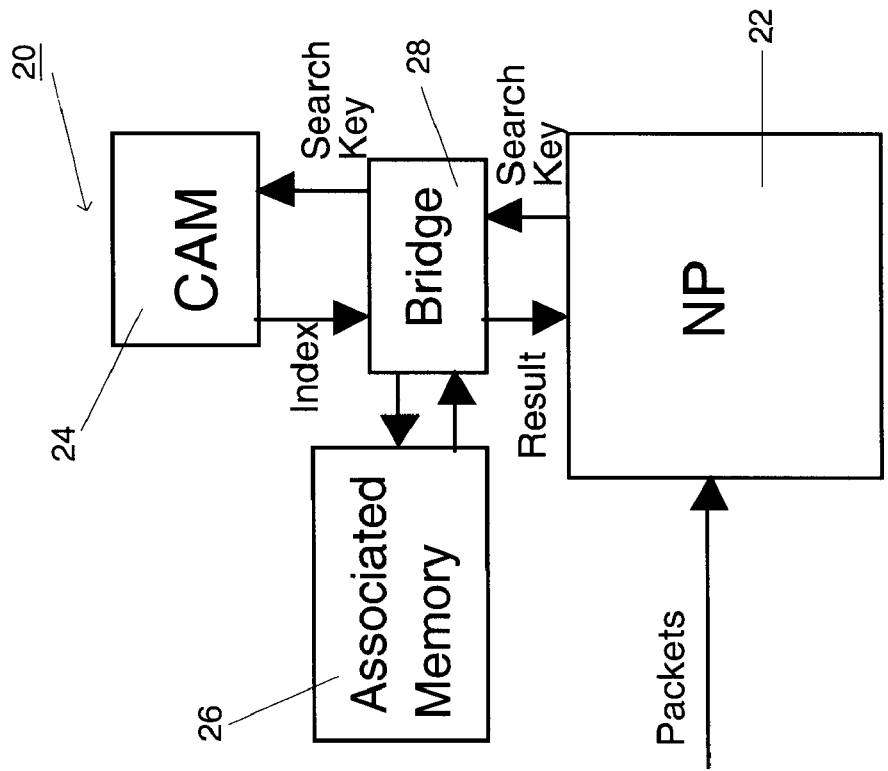
FIG. 1B shows a second example of a network switch/router with a network processor (NP), a CAM, an associated memory, and a bridge device.
Figure 1A:
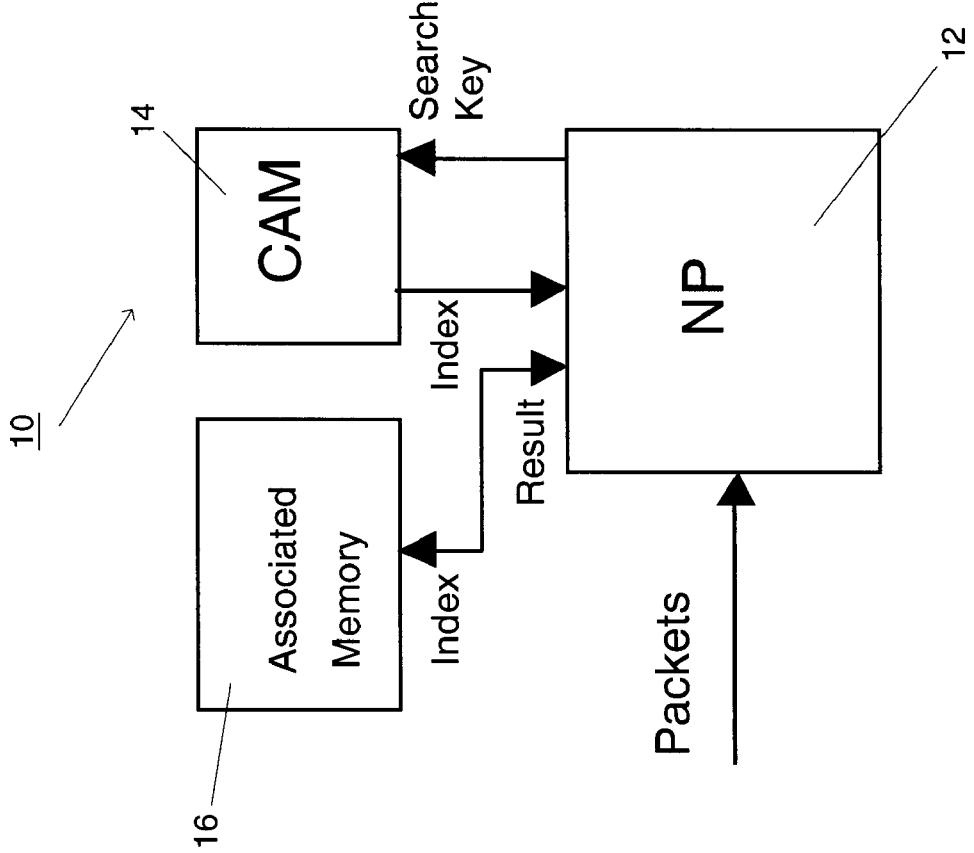
FIG. 1A shows a first example of a network switch/router with a network processor (NP), a CAM, and an associated memory.
Figure 2B:
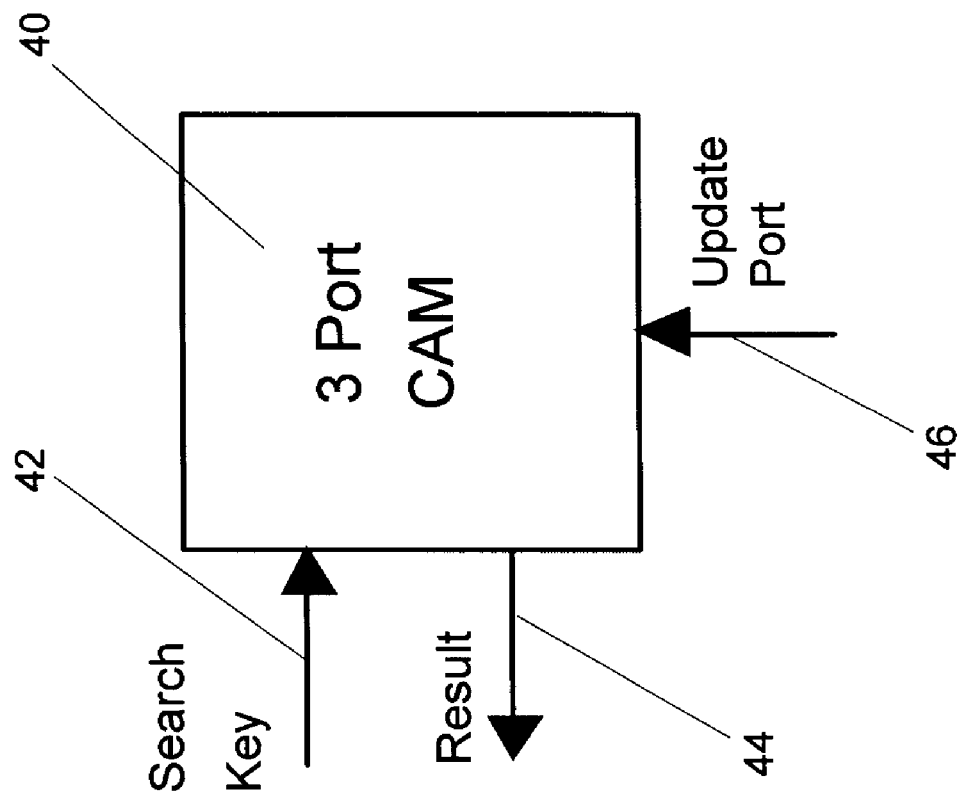
FIG. 2B shows a 3-port CAM having a search port, a result port, and an update port.
Figure 2A:
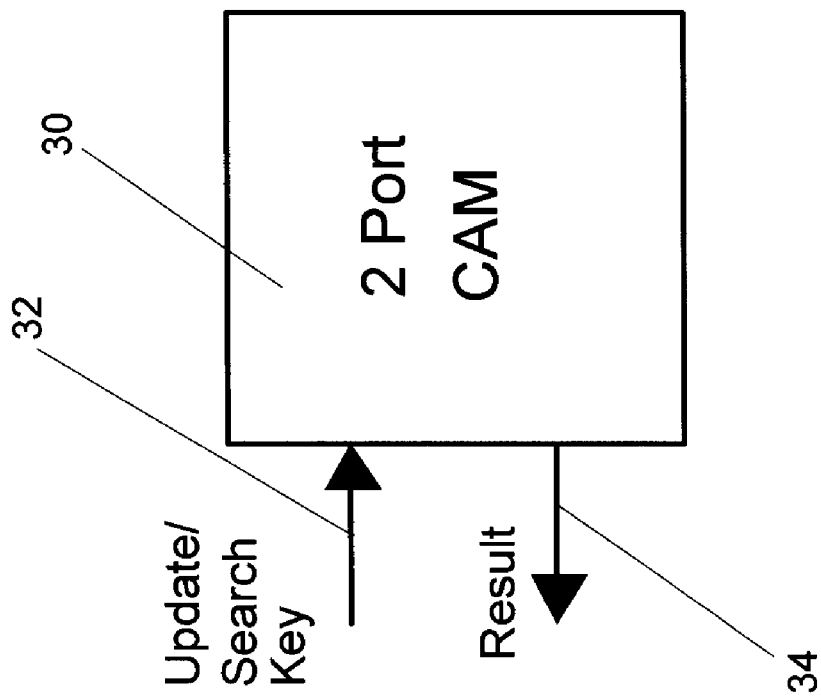
FIG. 2A shows a 2-port CAM having a combined update/search port and a result port.
Figure 3:
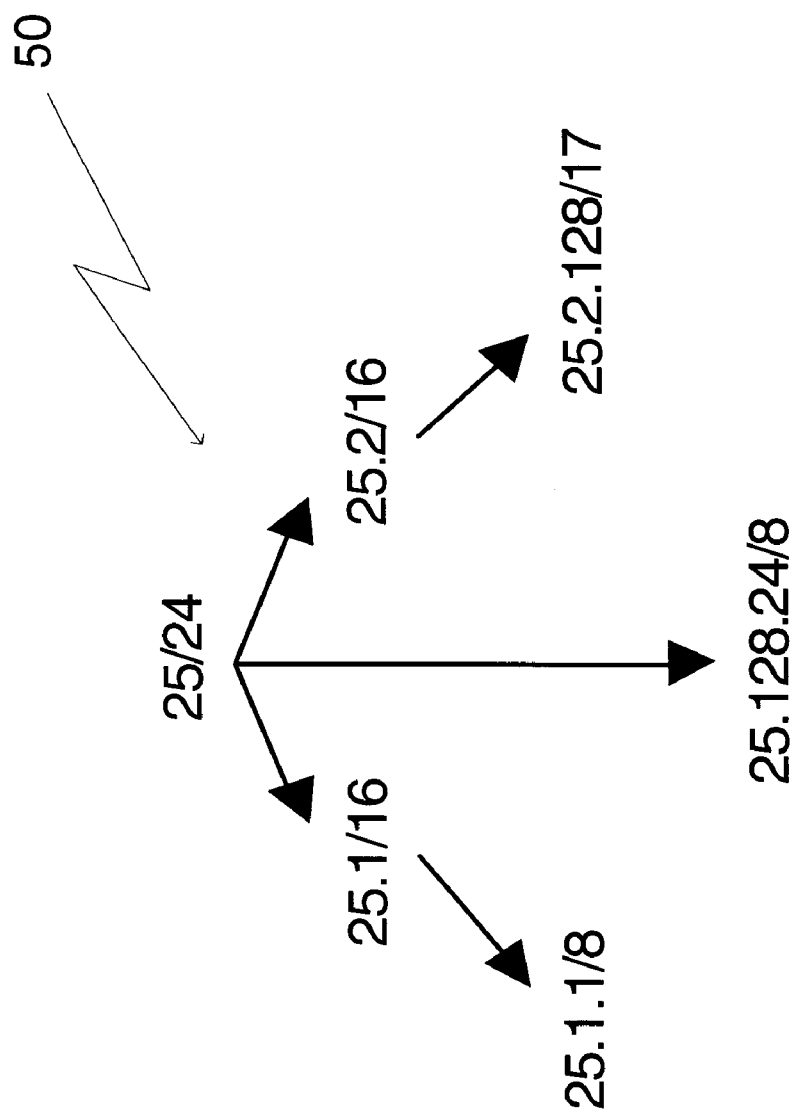
FIG. 3 shows an example of a prefix tree that may be stored in a TCAM.

Referring to FIG. 3, there is shown an example of a prefix tree 50 that may be stored in a TCAM. In the prefix tree 50 of FIG. 3, prefix 25/24 is a root prefix of a chain and has no ancestors. Prefixes 25.1.1/8, 25.2.128/17, and 25.128.24/8 are leaves of the prefix tree 50 and have no descendants.

The prefix tree 50 has three chains. A first chain includes prefixes 25/24, 25.1/16, and 25.1.1/8. A second chain includes prefixes 25/24 and 25.128.24/8. A third chain includes prefixes 25/24, 25.2/16, and 25.2.128/17.

In addition to supporting CIDR, there are requirements to classify flows based on a range of header fields. One example may be where the same action has to be performed on incoming packets if a transmission control protocol (TCP) source port identified in the headers of the incoming packets all fall within a certain range. Instead of maintaining an entry for each TCP source port in a binary CAM, TCAM's may encode the range using one or more wildcards and thus use a much smaller number of entries.

Figure 4:
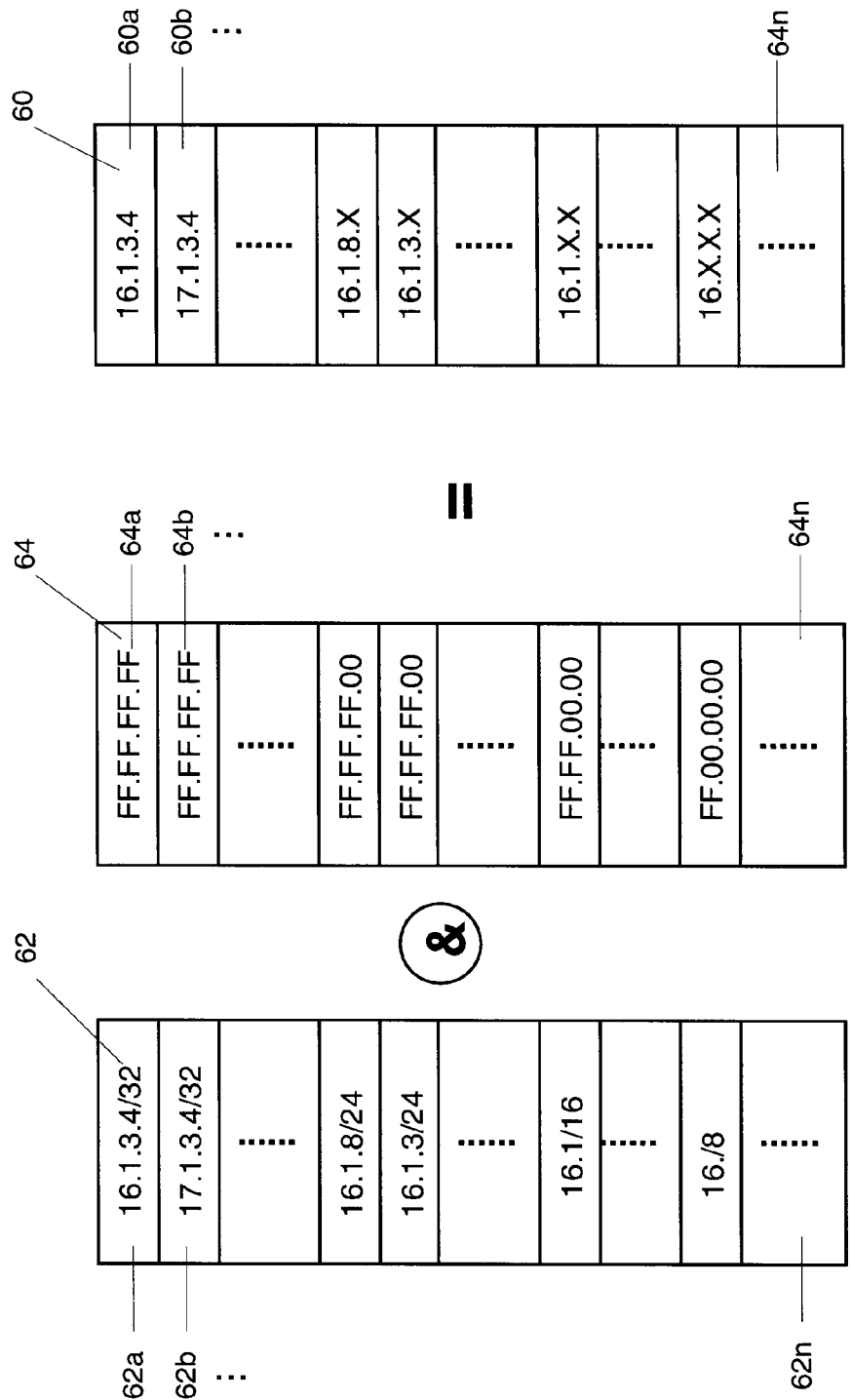
FIG. 4 illustrates how a record array is combined with a mask array so as to arrive at a compare array.

Referring to FIG. 4, there is shown an illustration of the operation that takes place to determine an array (i.e., a compare array 60) that is used to compare with a search prefix. That is, FIG. 4 illustrates how a record array 62 is combined with a mask array 64 so as to arrive at the compare array 60. The record array 62 includes a plurality of record entries 62a, 62b, . . . 62n. The mask array 64 includes a plurality of mask entries 64a, 64b, . . . 64n. The compare array 60 includes a plurality of compare entries 60a, 60b, . . . 60n. The record entries in the record array 62, and hence the compare entries in the compare array 60, are typically stored in a "sorted" manner in such a way that upon multiple matches for a route-prefix search, the lowest address entry is selected. In order for CIDR to work properly, a TCAM should ensure that the prefixes are stored in a descending length manner. Thus, upon a multiple match, the lowest address entry is indeed the longest prefix that is matched.

There are typically three ways to configure a TCAM: 1.) prefix-length based; 2.) prefix-chain based; and 3.) arbitrary. Each of these TCAM configurations will now be briefly described.

In a prefix-length based TCAM configuration, entries are sorted based on the constraint that a prefix of length L1 is placed at a lower address than a prefix of length L2, if L1>L2. There is no ordering constraint between prefixes of the same length.

Figure 5:
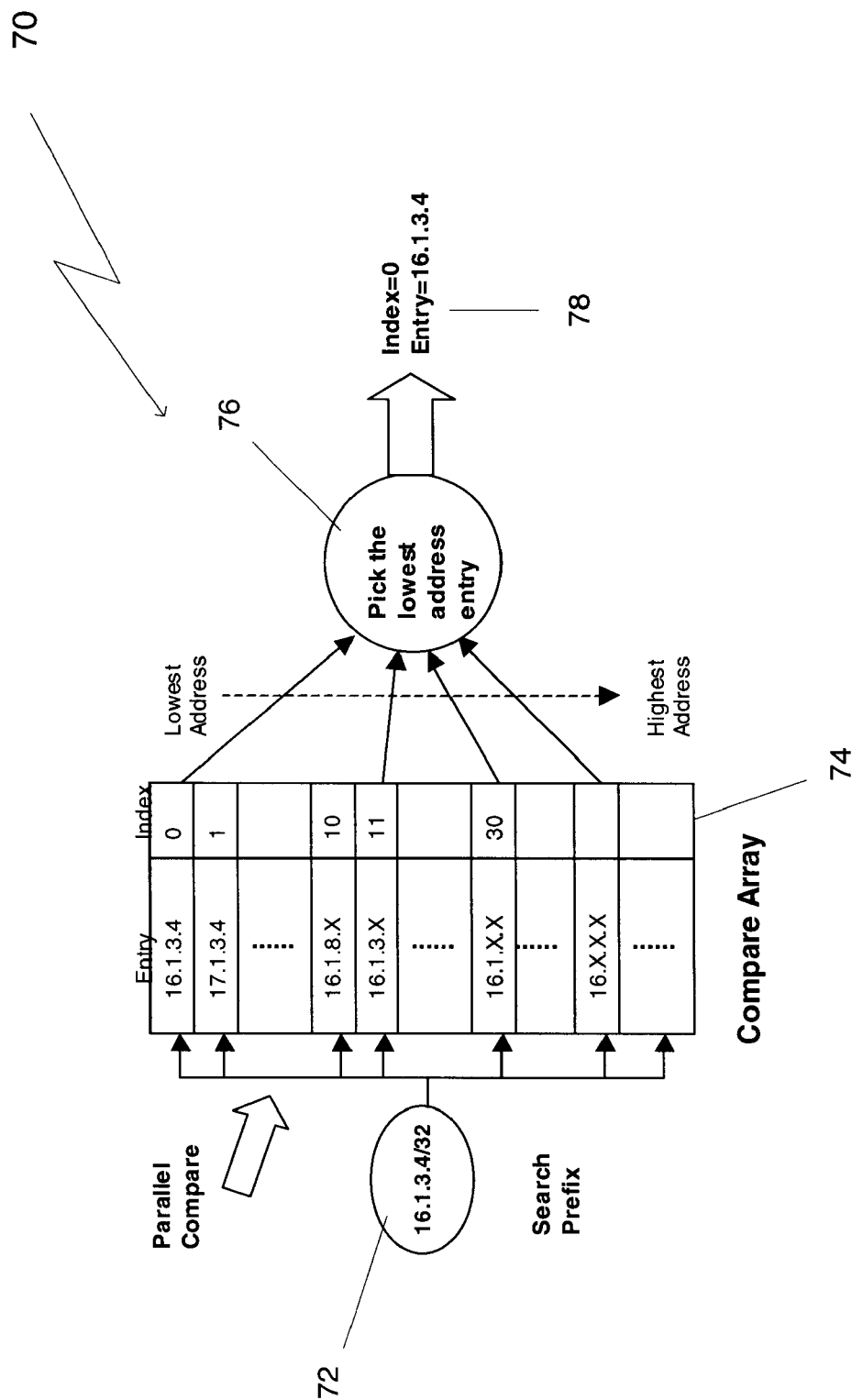
FIG. 5 illustrates how a search prefix is compared against entries in a compare array so as to produce a plurality of matches of which the one match having the lowest address entry is selected.

Referring to FIG. 5, there is shown an illustration of a search process in a TCAM 70 having a prefix-length based configuration. That is, FIG. 5 illustrates how a search prefix 72 is compared against entries in a compare array 74 so as to produce a plurality of matches 76 of which the one match 78 having the lowest address entry is selected. More particularly, a search request 72 for a prefix (PR) with a length (LEN) having the form PR/LEN is received by the TCAM 70. A search prefix comparand 72 is determined by adding X's to any bit positions of the prefix PR that exceed length LEN. The search prefix comparand 72 is compared in a parallel manner to all of the entries in the compare array 74 of the TCAM 70. The compare array 74 is typically generated using the process illustrated above with respect to FIG. 4. The comparison results in one or more matches 76. The match 78 having the lowest address (i.e., the longest prefix) is selected. It should be noted that each entry in the compare array 74 has a respective index that is used to read a result from an associated memory (not shown). As previously described, the result indicates what actions need to be taken on a packet.

The key feature of the above-described prefix-length based TCAM configuration is low search time, and that the search time is independent of the size of the routing table since the comparisons are done in parallel. The searches also happen in constant time.

In order to support searches in the manner described above, the entries in the compare array 74 have to be kept sorted. Thus, incremental updates (i.e., when an entry is added or deleted) in the TCAM 70 have to be done such that the entries in the compare array 74 are kept sorted. The most common way to do this is to divide the compare array 74 into N regions, where N is the maximum length of the search key. For example, N is 32 for IP routing addresses. Thus, a new entry having a prefix of length L is added in the region of the compare array 74 belonging to other entries having prefixes of length L. However, if there is no space for the new entry in region L, then time must be spent creating space for the new entry. The time spent depends on how the free spaces have been distributed in the compare array 74.

There are multiple options for distributing free space in the compare array 74, including: 1.) keeping all the free spaces at the bottom of the compare array 74; 2.) keeping all the free spaces at the middle of the compare array 74; and 3.) interspersing the different length regions with free space. In the first option (i.e., option 1), the new entry is added in the location of the first entry of region (L−1). The first entry of region (L−1) is moved to an empty space in region (L−1), which is in the bottom of region (L−1). If there is no space in region (L−1), then the "moved" entry of region (L−1) is added in the location of the first entry of region (L−2). And so on and so forth. Thus, there is a potential of L moves before an addition process may be completed. Also, the worst case update time is the time required for N moves, where N is the maximum prefix length.

In the second option (i.e., option 2), the free spaces are in the middle of the compare array 74. Thus, the empty spaces are between the regions (N/2)−1 and N/2, and the worst case update time is the time required for N/2 moves.

In the third option (i.e., option 3), the update time is one move until the time when there is no empty space in the region. It then degenerates into the complexity of the first option (i.e., option 1).

In a prefix-chain based TCAM configuration, the above-described length-based ordering constraint is applied only to prefixes belonging to the same prefix chain. That is, there is no ordering constraint between prefixes belonging to different prefix chains.

CIDR requires that the longest prefix amongst the matched prefixes be chosen. It should be noted that the prefixes that match the comparand have an ancestral relationship. For example, 10.2/16 is the ancestor of 10.2.3/10, but 22.3/16 is not. If the comparand is 10.2.3.12, the matched prefixes would be 10.2.3/10 and 10.2/16, and the longest prefix would be 10.2.3/10. Thus, it doesn't matter where 22.3/16 is placed in the TCAM with respect to the 10.2.X prefixes.

Instead of sorting all entries based on length, it is enough if the TCAM is organized such that only the prefixes that are related to each other are sorted according to length. That is, the non-related prefixes need not be sorted relative to each other. While no current products on the market configure a TCAM this way, this scheme is described in a paper by D. Shah and P. Gupta, entitled, "Fast Incremental Updates on Ternary-CAMs for Routing Lookups and Packet Classification", HOT Interconnects, 2000. However, the scheme described in the aforementioned paper requires new data structures to be stored in the TCAM along with the routing entries. In contrast, the present invention allows for a TCAM to be configured in a prefix-ancestor based configuration such that no new data structures are required to be stored in the TCAM.

In an arbitrary TCAM configuration, each entry in the TCAM has a length field, and an entry may be added to any empty space in the TCAM. However, the entries are not sorted. Rather, during a search, upon multiple matches, a sorter sorts the length fields of the matched entries and selects the entry having the maximum length. In this arbitrary TCAM configuration, the update time is constant, but the search time takes a hit. Netlogic Systems provides a product based upon such an arbitrary TCAM configuration.

Figure 6:
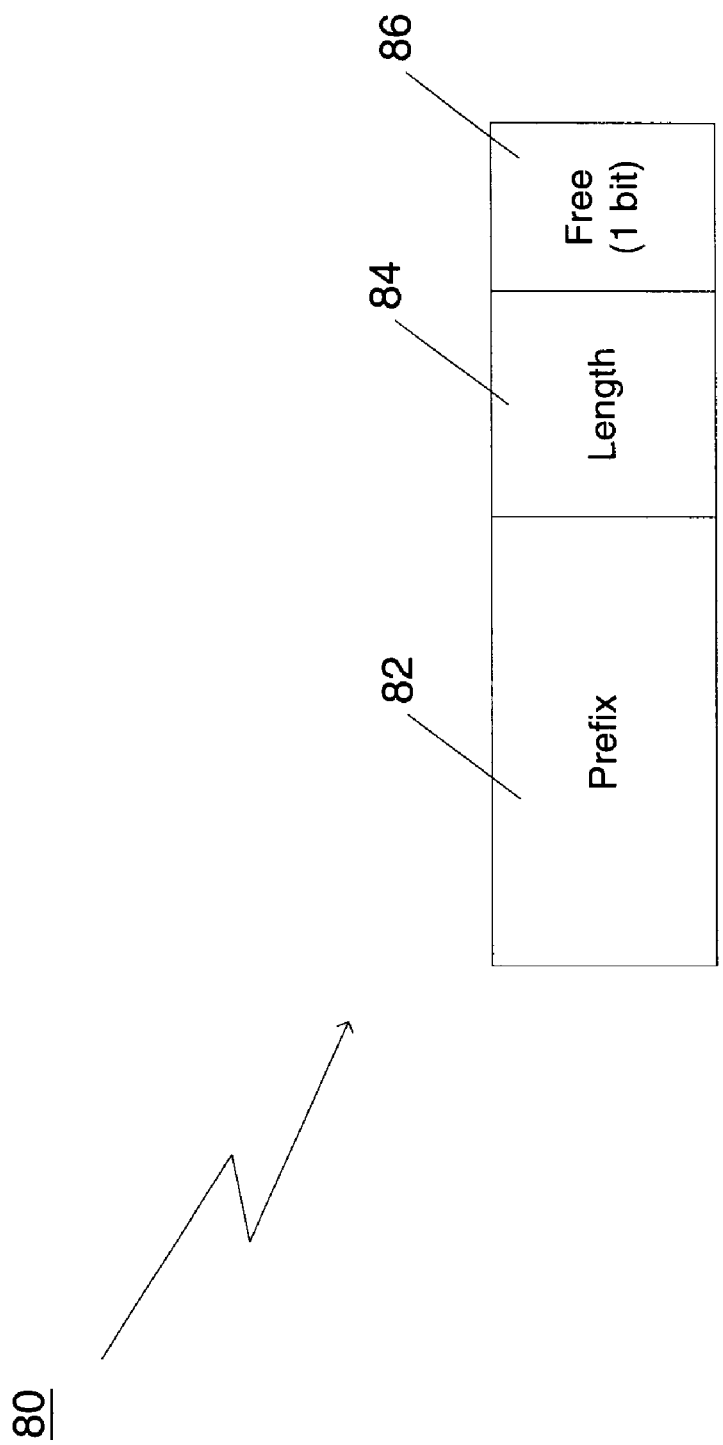
FIG. 6 shows a TCAM entry format having a prefix field, a length field, and a free bit.

Referring to FIG. 6, there is shown a TCAM entry format 80 having a prefix field 82, a length field 84, and a free bit 86. The prefix field 82 stores a prefix. The length field 84 stores the length of the prefix in the prefix field 82. The free bit 86 is used to indicate whether or not the entry is considered a free space entry. A TCAM entry with a free bit=1 is considered a free space entry. Thus, a new prefix can be added to such a free space entry.

In accordance with the present invention, a TCAM is updated by adding a new prefix (PR) with a length (LEN) to one of a plurality of free space entries in the TCAM in such a manner that the update time is minimized. The plurality of free space entries are all maintained in the middle of the TCAM, in a so-called free zone. Entries with prefix lengths greater than a threshold $L_{thr}$ are added above the free zone, while entries with prefix lengths less than or equal to the threshold $L_{thr}$ are added below the free zone. The value of the threshold $L_{thr}$ may be set locally at the TCAM, or globally throughout the network of which the TCAM is a part.

Figure 7:
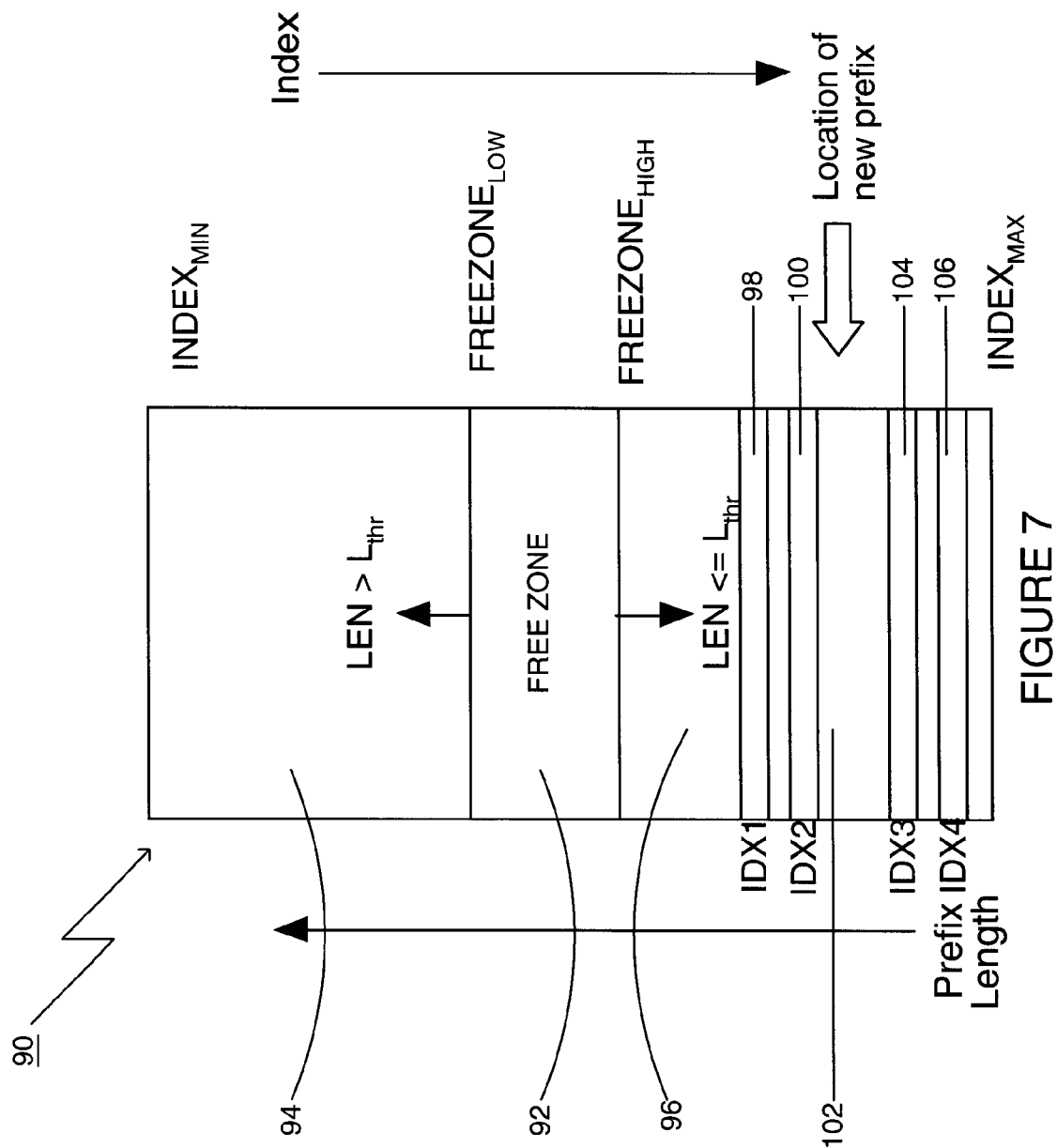
FIG. 7 shows an example of a TCAM having a free zone located in the middle of the TCAM between an upper region, wherein entries with prefix lengths that are greater than a threshold $L_{thr}$ are added, and a lower region, wherein entries with prefix lengths that are less than or equal to the threshold $L_{thr}$ are added, in accordance with the present invention.

Referring to FIG. 7, there is shown an example of a TCAM 90 along the lines of that just described wherein free space entries are maintained in a free zone 92 in the middle of the TCAM 90. That is, the free zone 92 is located between an upper region 94, wherein entries with prefix lengths that are greater than a threshold $L_{thr}$ are added, and a lower region 96, wherein entries with prefix lengths that are less than or equal to the threshold $L_{thr}$ are added. The free space entries in the TCAM 90 are always maintained in contiguous locations in the free zone 92. $FREEZONE_{LOW}$ and $FREEZONE_{HIGH}$ indicate the boundaries of the free zone 92 in the TCAM 90.

Each entry in the TCAM 90 has a respective index which, as previously described, is used to read a result from an associated memory (not shown). The indexes associated with the entries in the TCAM 90 range from a lowest index ($INDEX_{MIN}$) to a highest index ($INDEX_{MAX}$). A prefix of 255.255.255.255/32 is stored in the lowest index ($INDEX_{MIN}$) of the TCAM 90. This prefix is 32 bits in length, and is generally not a valid prefix. A prefix of X.X.X.X/0 is stored in the highest index ($INDEX_{MAX}$) of the TCAM 90. This prefix is of zero length, and is called the global root. $FREEZONE_{LOW}$ and $FREEZONE_{HIGH}$ are the lowermost index and the uppermost index of the free zone 92, respectively.

At this point it should be noted that during initialization of the TCAM 90, all entries from ($INDEX_{MIN}$+1) to ($INDEX_{MAX}$−1) are set as free space entries (i.e., with free bits=1). Also, $FREEZONE_{LOW}$ is set to ($INDEX_{MIN}$+1) and $FREEZONE_{HIGH}$ is set to ($INDEX_{MAX}$−1).

It is assumed that the prefix (PR) to be added to the TCAM 90 may qualify to be either a member of an existing prefix chain in the TCAM 90, or a root prefix having no ancestors or descendants in the TCAM 90. Each member of the existing prefix chain in the TCAM 90 is an entry in the TCAM 90, and is sorted according to prefix length in the TCAM 90.

It is also assumed that the TCAM 90 includes a set of indexes represented by $\{IDX_{GRT}\}$. Each of the indexes in $\{IDX_{GRT}\}$ is associated with a respective entry which is a member of the existing prefix chain and which has a prefix with a length that is greater than the length (LEN) of the prefix (PR) to be added to the TCAM 90. However, if there are no such entries which meet the aforementioned constraints, then $\{IDX_{GRT}\}$ is an empty set (i.e., $\{IDX_{GRT}\}$=NULL).

Of all the indexes in $\{IDX_{GRT}\}$, the largest index is represented by $MAX\_IDX_{GRT}$. The length of the prefix in the entry that is associated with the index $MAX\_IDX_{GRT}$ is represented by $LEN_{GRT}$. Also, $\{IDX^U_{GRT}\}$ represents a subset of $\{IDX_{GRT}\}$ containing indexes that are associated with entries having prefixes with lengths that are greater than $L_{thr}$. Further, $\{IDX^L_{GRT}\}$ represents a subset of $\{IDX_{GRT}\}$ containing indexes that are associated with entries having prefixes with lengths that are less than or equal to $L_{thr}$.

Analogously, it is further assumed that the TCAM 90 includes a set of indexes represented by $\{IDX_{SML}\}$. Each of the indexes in $\{IDX_{SML}\}$ is associated with a respective entry which is a member of the existing prefix chain and which has a prefix with a length that is less than the length (LEN) of the prefix (PR) to be added to the TCAM 90. At a minimum, $\{IDX_{SML}\}$ always contains $INDEX_{MAX}$ since this index is associated with the entry having the global root prefix with the smallest possible length.

Of all the indexes in $\{IDX_{SML}\}$, the smallest index is represented by $MIN\_IDX_{SML}$. The length of the prefix in the entry that is associated with the index $MIN\_IDX_{SML}$ is represented by $LEN_{SML}$. Also, $\{IDX^U_{SML}\}$ represents a subset of $\{IDX_{SML}\}$ containing indexes that are associated with entries having prefixes with lengths that are greater than $L_{thr}$. Further, $\{IDX^L_{SML}\}$ represents a subset of $\{IDX_{SML}\}$ containing indexes that are associated with entries having prefixes with lengths that are less than or equal to $L_{thr}$.

In view of the foregoing, in the example of FIG. 7, IDX1 is an index associated with an entry 98, IDX2 is an index associated with an entry 100, IDX3 is an index associated with an entry 104, and IDX4 is an index associated with an entry 106. Entry 98, entry 100, entry 104, and entry 106 are all members of the existing prefix chain to which the prefix (PR) to be added to the TCAM 90 may qualify to be a member. Thus, in the example of FIG. 7, $\{IDX_{GRT}\}$={IDX1, IDX2}, $\{IDX_{SML}\}$={IDX3, IDX4 and $INDEX_{MAX}$}, $MAX\_IDX_{GRT}$=IDX2, $MIN\_IDX_{SML}$=IDX3, $LEN_{SML}$= the length of the prefix in the entry associated with IDX3, $LEN_{GRT}$=the length of the prefix in the entry associated with IDX2, $\{IDX^U_{GRT}\}$=NULL, $\{IDX^L_{GRT}\}$={IDX1, IDX2}, $\{IDX^U_{SML}\}$=NULL, and $\{IDX^L_{SML}\}$={IDX3, IDX4 and $INDEX_{MAX}$}.

When adding the new prefix (PR) with the length (LEN) to the TCAM 90, the sets $\{IDX_{GRT}\}$ and $\{IDX_{SML}\}$ must first be determined. This is accomplished by first performing a prefix search of the new prefix (PR) and its length (LEN) in the TCAM 90, which requires the generation of a compare array. To generate the compare array, a global mask having a length that is equal to the length (LEN) of the new prefix (PR) is used, in addition to a mask of each entry. The global mask is generated by setting logic ones in the upper bits and logic zeroes in the lower bits of the global mask. For example, if LEN=8, then the global mask is 255.0.0.0.

The effective mask applied to each entry k, is determined as follows: effective_mask(k)=mask(k) & global_mask (LEN), wherein "&" is a logical bitwise AND operator. Thus, each entry k in the compare array is determined as follows: compare(k)=effective_mask(k) & entry(k). Each bit location j in the compare entry k is determined using ternary logic. For example, if bit j in a mask register is 0, then a resulting bit j in a compare register is X. If the bit j in the mask register is 1, then the resulting bit j in the compare register is equal to bit j of an entry register.

The length (LEN) of the new prefix (PR) is extended by adding X's in any bit locations extending beyond the length (LEN) of the new prefix (PR). This new prefix having an extended length is called an extended prefix.

A parallel compare of the extended prefix is performed against the compare array. This comparison may result in a number of entries having prefixes that match the extended prefix. By definition, all of the entries having prefixes that match the extended prefix are members of the same prefix chain.

The entries having prefixes that match the extended prefix, which by definition are all members of the same prefix chain, may include entries having prefixes with lengths that are greater than the length (LEN) of the prefix (PR) to be added to the TCAM 90. All of these entries have associated indexes which, when combined, form the set of indexes represented by $\{IDX_{GRT}\}$. However, as previously defined, if there are no such entries, then $\{IDX_{GRT}\}$ is an empty set (i.e., $\{IDX_{GRT}\}$=NULL).

As previously defined, the largest index in $\{IDX_{GRT}\}$ is represented by $MAX\_IDX_{GRT}$, and the length of the prefix in the entry that is associated with the index $MAX\_IDX_{GRT}$ is represented by $LEN_{GRT}$. As also previously defined, $\{IDX^U_{GRT}\}$ represents a subset of $\{IDX_{GRT}\}$ containing indexes that are associated with entries having prefixes with lengths that are greater than $L_{thr}$, and $\{IDX^L_{GRT}\}$ represents a subset of $\{IDX_{GRT}\}$ containing indexes that are associated with entries having prefixes with lengths that are less than or equal to $L_{thr}$.

Analogously, the entries having prefixes that match the extended prefix, which by definition are all members of the same prefix chain, may include entries having prefixes with lengths that are less than the length (LEN) of the prefix (PR) to be added to the TCAM 90. All of these entries have associated indexes which, when combined, form the set of indexes represented by $\{IDX_{SML}\}$. As previously mentioned, at a minimum, $\{IDX_{SML}\}$ always contains $INDEX_{MAX}$ since this index is associated with the entry having the global root prefix with the smallest possible length.

As previously defined, the smallest index in $\{IDX_{SML}\}$ is represented by $MIN\_IDX_{SML}$, and the length of the prefix in the entry that is associated with the index $MIN\_IDX_{SML}$ is represented by $LEN_{SML}$. As also previously defined, $\{IDX^U_{SML}\}$ represents a subset of $\{IDX_{SML}\}$ containing indexes that are associated with entries having prefixes with lengths that are greater than $L_{thr}$, and $\{IDX^L_{SML}\}$ represents a subset of $\{IDX_{GRT}\}$ containing indexes that are associated with entries having prefixes with lengths that are less than or equal to $L_{thr}$.

Once the contents of $\{IDX_{GRT}\}$ and $\{IDX_{SML}\}$ are determined, the index 102 where the new prefix (PR) is to be added to the TCAM 90 may be determined. While it is known that this index 102 identifies a free space entry between MIN_IDX$_{SML}$ and MAX_IDX$_{GRT}$, the exact value of this index 102 depends upon the contents of $\{IDX_{GRT}\}$ and $\{IDX_{SML}\}$. There are four separate cases for determining the exact value of the index 102 where the new prefix (PR) is to be added to the TCAM 90 based upon the contents of $\{IDX_{GRT}\}$ and $\{IDX_{SML}\}$.

At this point it should be noted that, in some of these cases, a move operation must be performed to make a free space entry available for the new prefix (PR). Such a move operation may include a move-up operation or a move-down operation. At the outset, let $\{IDX\}$ be a set of indexes. Also, let the cardinality of the set $\{IDX\}$ be N, and let an element k in the set $\{IDX\}$ be denoted as index[k]. The elements in $\{IDX\}$ are sorted in an ascending manner. That is, index[j]<index[j+1], for $1 \leq j < N$.

In accordance with the present invention, a move-up operation is represented by following notation: MOVE_UP ($\{IDX\}$, start_idx), wherein start_idx=index[start]. For each element j in the set $\{IDX\}$, for $1 < j \leq$ start, the move-up operation moves the entry at index[j] to index[j−1]. The entry at index[1] is moved to FREEZONE$_{HIGH}$.

In accordance with the present invention, a move-down operation is represented by following notation: MOVE_DOWN ($\{IDX\}$, start_idx), wherein start_idx=index[start]. For each element j in the set $\{IDX\}$, for start$\leq$j<N, the move-down operation moves the entry at index[j] to index [j+1]. The entry at index[N] is moved to FREEZONE$_{LOW}$.

Figure 8:
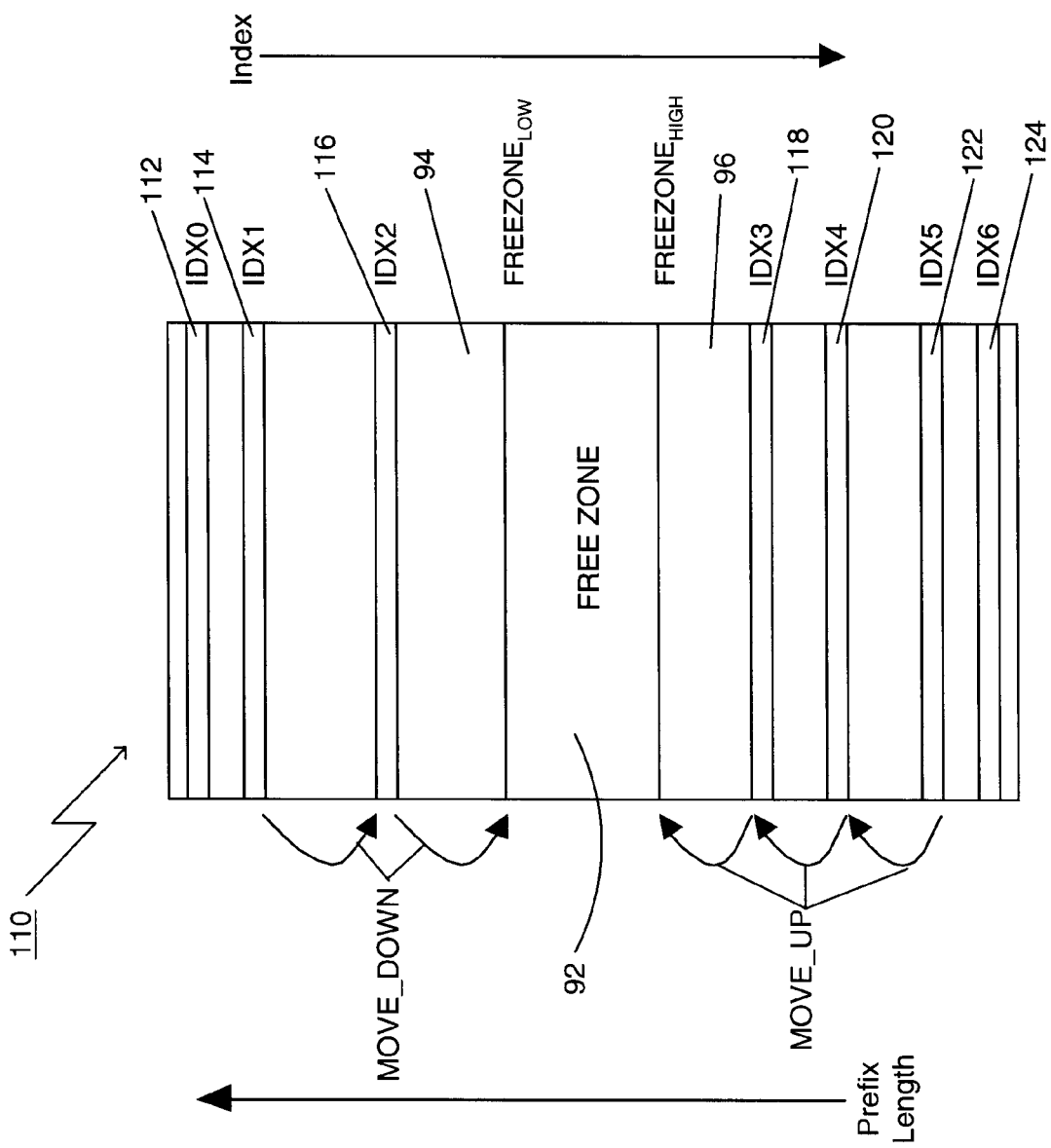
FIG. 8 shows an example of a TCAM wherein move-up and move-down operations are performed in accordance with the present invention.

Referring to FIG. 8, there is shown an example of a TCAM 110 wherein move-up and move-down operations are performed. IDX0 is an index associated with an entry 112, IDX1 is an index associated with an entry 114, IDX2 is an index associated with an entry 116, IDX3 is an index associated with an entry 118, IDX4 is an index associated with an entry 120, IDX5 is an index associated with an entry 122, and IDX6 is an index associated with an entry 124. Entries 112–124 are all members of the same prefix chain to which the pref ix (PR) to be added to the TCAM 110 may qualify to become a member.

For the move-up operation shown in FIG. 8, the set $\{IDX\}$=$\{IDX3, IDX4, IDX5, IDX6\}$. The MOVE_UP ($\{IDX\}$, IDX5) operation is performed, wherein the entry 118 at IDX3 is moved to FREEZONE$_{HIGH}$, the entry 120 at IDX4 is moved to IDX3, and the entry 122 at IDX5 is moved to IDX4.

For the move-down operation shown in FIG. 8, the set $\{IDX\}$=$\{IDX0, IDX1, IDX2\}$. The MOVE_DOWN ($\{IDX\}$, IDX1) operation is performed, wherein the entry 116 at IDX2 is moved to FREEZONE$_{LOW}$ and the entry 114 at IDX1 is moved to IDX2.

The time complexity in each of these move operations is the number of individual moves occurring in the move. In the above examples shown in FIG. 8, the move-up operation required 3 moves, while the move-down operation required 2 moves.

At this point it should be noted that, in addition to moving prefix entries, the aforementioned move-up and move-down operations also move respective mask entries in a corresponding mask table. For example, in the above-described move-down operation, if the prefix entry 114 at IDX1 had a respective mask entry in a corresponding mask table, the mask entry would be moved to IDX2 when the prefix entry 114 is moved to IDX2.

Returning to FIG. 7, the first case is when MIN_IDX$_{SML}$=INDEX$_{MAX}$ and $\{IDX_{GRT}\}$=NULL. In this case, the new prefix (PR) being added is a root prefix and is the only prefix in its chain. That is, there are no ancestors or descendants of the new prefix (PR) in the TCAM 90. If LEN>$L_{thr}$, then the new prefix (PR) is added at the free space entry identified by the index FREEZONE$_{LOW}$. Otherwise, if LEN$\leq L_{thr}$, then the new prefix (PR) is added at the free space entry identified by the index FREEZONE$_{HIGH}$.

The second case is when MIN_IDX$_{SML}$<INDEX$_{MAX}$ and $\{IDX_{GRT}\}$=NULL. In this case, the new prefix (PR) being added has the maximum length in its chain. That is, there are no descendants of the new prefix (PR) in the TCAM 90. Thus, the new prefix (PR) may be added at a free space entry between index INDEX$_{MIN}$ and index MIN_IDX$_{SML}$. Two cases of LEN$_{SML}$ are considered.

If LEN$_{SML} \leq L_{thr}$ and LEN>$L_{thr}$, then the new prefix (PR) is added at the free space entry identified by the index FREEZONE$_{LOW}$. Otherwise, if LEN$_{SML} \leq L_{thr}$ and LEN$\leq L_{thr}$, then the new prefix (PR) is added at the free space entry identified by the index FREEZONE$_{HIGH}$.

When LEN$_{SML}$>$L_{thr}$, LEN has to be more than $L_{thr}$. In such a case, a free space entry must be created just above the entry at index MIN_IDX$_{SML}$. A move-down operation is utilized to create this free space entry. That is, the MOVE_DOWN ($\{IDX^U_{SML}\}$, MIN_IDX$_{SML}$) operation is performed to create this free space entry. This operation moves down all of the entries associated with the indexes in $\{IDX^U_{SML}\}$, starting with the entry at index MIN_IDX$_{SML}$. This creates a free space entry at index MIN_IDX$_{SML}$. Thus, the new prefix (PR) is added at the free space entry identified by the index MIN_IDX$_{SML}$.

The third case is when MIN_IDX$_{SML}$=INDEX$_{MAX}$ and $\{IDX_{GRT}\}\neq$NULL. In this case, the new prefix (PR) being added is a root prefix. It has no ancestors, however there are descendants to the new prefix (PR) in the TCAM 90. Thus, the new prefix (PR) may be added at a free space entry between index MAX_IDX$_{GRT}$ and index INDEX$_{MAX}$. Two cases of LEN$_{GRT}$ are considered.

When LEN$_{GRT} \leq L_{thr}$, LEN has to be less than LEN$_{GRT}$. In such a case, a free space entry must be created just below the entry at index IDX$_{GRT}$. A move-up operation is utilized to create this free space entry. That is, the MOVE_UP ($\{IDX^L_{GRT}\}$, MAX_IDX$_{GRT}$) operation is performed to create this free space entry. This operation moves up all of the entries associated with the indexes in $\{IDX^L_{GRT}\}$, starting with the entry at index MAX_IDX$_{GRT}$. This creates a free space entry at index MAX_IDX$_{GRT}$. Thus, the new prefix (PR) is added at the free space entry identified by the index MAX_IDX$_{GRT}$.

If LEN$_{GRT}$>$L_{thr}$ and LEN$\leq L_{thr}$, then the new prefix (PR) is added at the free space entry identified by the index FREEZONE$_{HIGH}$. However, if LEN$_{GRT}$>$L_{thr}$ and LEN>$L_{thr}$, then a free space entry must be created just below the entry at MAX_IDX$_{GRT}$. A move-down operation is utilized to create this free space entry. That is, the MOVE_DOWN ($\{IDX^U_{GRT}\}$, NXT_IDX$_{GRT}$) operation is performed to create this free space entry, wherein NXT_IDX$_{GRT}$= IDX$^U_{GRT}$[k+1] and MAX_IDX$_{GRT}$=IDX$^U_{GRT}$[k]. This operation moves down all of the entries associated with the indexes in the $\{IDX^U_{GRT}\}$, starting with the entry at index NXT_IDX$_{GRT}$. This creates a free space entry at index NXT_IDX$_{GRT}$, which is where the new prefix (PR) is added. However, if k is indeed the cardinality of {IDX$^U_{GRT}$}, the new prefix (PR) is added at the free space entry identified by the index FREEZONE$_{LOW}$ because MAX_IDX$_{GRT}$ is the last index in the prefix chain before the free zone 92.

The fourth case is when MIN_IDX$_{SML}$<INDEX$_{MAX}$, and {IDX$_{GRT}$}≠NULL. In this case, the new prefix (PR) has both ascendants and descendants in the TCAM 90. Thus, the new prefix (PR) may be added at a free space entry between index MAX_IDX$_{GRT}$ and index MIN_IDX$_{SML}$. All the cases of LEN$_{GRT}$ and LEN$_{SML}$ are considered.

When LEN$_{SML}$≦L$_{thr}$ and LEN$_{GRT}$≦L$_{thr}$, the new prefix (PR) has to be added in the region below the free zone 92. A free space entry may be created just above the entry at index MIN_IDX$_{SML}$ or just below the entry at index MAX_IDX$_{GRT}$. Since the entry at MAX_IDX$_{GRT}$ is closer to the free zone 92, the free space entry is created just below the entry at index MAX_IDX$_{GRT}$. A move-up operation is utilized to create this free space entry. That is, the MOVE_UP ({IDX$^L_{GRT}$}, MAX_IDX$_{GRT}$) operation is performed to create this free space entry. This operation moves up all of the entries associated with the indexes in {IDX$^L_{GRT}$}, starting with the entry at index MAX_IDX$_{GRT}$. This creates a free space entry at index MAX_IDX$_{GRT}$. Thus, the new prefix (PR) is added at the free space entry identified by the index MAX_IDX$_{GRT}$.

When LEN$_{SML}$≦L$_{thr}$ and LEN$_{GRT}$>L$_{thr}$, the indexes MAX_IDX$_{GRT}$ and MIN_IDX$_{SML}$ are at different ends of the free zone 92. Where the new prefix (PR) is added depends upon LEN. If LEN<L$_{thr}$, the new prefix (PR) is added at the free space entry identified by index FREEZONE$_{HIGH}$. However, if LEN>L$_{thr}$, a free space entry must be created just below the entry at MAX_IDX$_{GRT}$. A move-down operation is utilized to create this free space entry. That is, the MOVE_DOWN ({IDX$^U_{GRT}$}, NXT_IDX$_{GRT}$) operation is performed to create this free space entry, wherein NXT_IDX$_{GRT}$=IDX$^U_{GRT}$[k+1] and MAX_IDX$_{GRT}$=IDX$^U_{GRT}$[k]. This operation moves down all of the entries associated with the indexes in the {IDX$^U_{GRT}$}, starting with the entry at index NXT_IDX$_{GRT}$. This creates a free space entry at index NXT_IDX$_{GRT}$, which is where the new prefix (PR) is added. However, if k is indeed the cardinality of {IDX$^U_{GRT}$}, the new prefix (PR) is added at the free space entry identified by the index FREEZONE$_{LOW}$ because MAX_IDX$_{GRT}$ is the last index in the prefix chain before the free zone 92.

When LEN$_{SML}$>L$_{thr}$ and LEN$_{GRT}$>L$_{thr}$, the new prefix (PR) has to be added in the region above the free zone 92. Since the entry at MIN_IDX$_{SML}$ is closer to the free zone 92, a free space entry is created above the entry at index MIN_IDX$_{SML}$. A move-down operation is utilized to create this free space entry. That is, the MOVE_DOWN ({IDX$^U_{SML}$}, MIN_IDX$_{SML}$) operation is performed to create this free space entry. This operation moves down all of the entries associated with the indexes in {IDX$^U_{SML}$}, starting with the entry at index MIN_IDX$_{SML}$. This creates a free space entry at index MIN_IDX$_{SML}$. Thus, the new prefix (PR) is added at the free space entry identified by the index MIN_IDX$_{SML}$.

After adding the new prefix (PR), the free zone boundaries (i.e., FREEZONE$_{LOW}$ and FREEZONE$_{HIGH}$) are updated. That is, if the new prefix (PR) was added in the upper half of the TCAM 90, FREEZONE$_{LOW}$ is incremented by 1. If the new prefix (PR) was added in the lower half of the TCAM 90, FREEZONE$_{HIGH}$ is decremented by 1.

When deleting a prefix (PR) with a length (LEN) from the TCAM 90, a delete operation must be performed. That is, since the free zone 92 is maintained consolidated in the middle of the TCAM 90, a clean-up operation must be performed during a prefix deletion event. The clean-up operation may occur on a periodic or intermittent basis and may be pre-empted. That is, it does not prevent update or search operations.

At this point it should be noted that, upon prefix deletion, a block move must be performed to consolidate free space entries in the free zone 92. In accordance with the present invention, a block move is represented by following notation: BlockMove (j, k, N). That is, the notation BlockMove (j, k, N) represents an operation wherein the TCAM 90 moves N entries starting at index j to N entries starting at index k. Thus, the new indexes of the entries that were in j, j+1, . . . , j+N are now k, k+1, . . . , k+N. In addition to moving prefix entries, respective mask entries in a corresponding mask table are also moved.

Upon the deletion of a prefix (PR) with a length (LEN) at index IDX, a clean-up operation based upon the value of the length (LEN) of the deleted prefix (PR) is performed. That is, if LEN>L$_{thr}$, then the BlockMove (IDX+1, IDX, (FREEZONE$_{LOW}$–IDX)) is performed. The free bit in the entry at index (FREEZONE$_{LOW}$–1) is then set to 1. Alternatively, if LEN≦L$_{thr}$, then the BlockMove (IDX–1, IDX, (IDX–FREEZONE$_{HIGH}$)) is performed. The free bit in the entry at index (FREEZONE$_{HIGH}$+1) is then set to 1.

At this point it should be noted that prefix search operations are not adversely affected by maintaining the consolidated free zone 92 in the middle of the TCAM 90 in accordance with the present invention. That is, the prefix search process remains the same as in traditional CAM's. Thus, there is no increase in search complexity or search time.

At this point it should be noted that updating a content addressable memory in accordance with the present invention as described above typically involves the processing of input data and the generation of output data to some extent. This input data processing and output data generation may be implemented in hardware or software. For example, specific electronic components may be employed in a content addressable memory or related circuitry for implementing the functions associated with updating a content addressable memory in accordance with the present invention as described above. Alternatively, one or more processors operating in accordance with stored instructions may implement the functions associated with updating a content addressable memory in accordance with the present invention as described above. If such is the case, it is within the scope of the present invention that such instructions may be stored on one or more processor readable media, or transmitted to one or more processors via one or more signals.

In summary, the present invention provides a new technique for configuring and managing a TCAM. Unlike existing CAM designs, the present invention places ordering constraints only when necessary. All this is achieved without increasing prefix search time.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for updating a content addressable memory having a plurality of entries, each of the plurality of entries having a prefix field, a prefix length field, and an associated index identifier, the method comprising the steps of:

determining a first set of index identifiers, each index identifier in the first set of index identifiers being associated with a respective entry in a first set of the plurality of entries, each entry in the first set of entries having a respective prefix with a respective prefix length that is greater than a third prefix length of a third prefix to be added to the content addressable memory;

determining a second set of index identifiers, each index identifier in the second set of index identifiers being associated with a respective entry in a second set of the plurality of entries, each entry in the second set of entries having a respective prefix with a respective prefix length that is less than the third prefix length of the third prefix to be added to the content addressable memory; and determining a third index identifier, based upon the first set of index identifiers and the second set of index identifiers, associated with a third of the plurality of entries where the third prefix with the third prefix length may be added to the content addressable memory, the third index identifier being located in one of or between the first set of index identifiers and the second set of index identifiers.

2. The method as defined in claim 1, wherein each entry in the first set of entries is a member of a common prefix chain.

3. The method as defined in claim 2, wherein each entry in the second set of entries is also a member of the common prefix chain.

4. The method as defined in claim 3, wherein all members of the common prefix chain are sorted according to their respective prefix lengths.

5. The method as defined in claim 4, wherein the step of determining the first set of index identifiers comprises the step of:

searching the content addressable memory for entries having prefixes with prefix lengths which match the third prefix having the third prefix length.

6. The method as defined in claim 5, wherein the step of searching the content addressable memory comprises the steps of:

generating a compare array having a plurality of compare array entries corresponding to the plurality of entries in the content addressable memory, each of the plurality of compare array entries having a compare array prefix and an associated index identifier corresponding to the index identifier of a respective entry in the content addressable memory;

extending the third prefix length of the third prefix to obtain an extended third prefix with an extended third prefix length; and comparing the extended third prefix to the plurality of compare array prefixes so as to identify index identifiers associated with compare array prefixes which match the extended third prefix, each identified index identifier corresponding to a respective entry in the content addressable memory that is a member of the common prefix chain.

7. The method as defined in claim 4, wherein the step of determining the second set of index identifiers comprises the step of:

searching the content addressable memory for entries having prefixes with prefix lengths which match the third prefix having the third prefix length.

8. The method as defined in claim 7, wherein the step of searching the content addressable memory comprises the steps of:

generating a compare array having a plurality of compare array entries corresponding to the plurality of entries in the content addressable memory, each of the plurality of compare array entries having a compare array prefix and an associated index identifier corresponding to the index identifier of a respective entry in the content addressable memory;

extending the third prefix length of the third prefix to obtain an extended third prefix with an extended third prefix length; and comparing the extended third prefix to the plurality of compare array prefixes so as to identify index identifiers associated with compare array prefixes which match the extended third prefix, each identified index identifier corresponding to a respective entry in the content addressable memory that is a member of the common prefix chain.

9. The method as defined in claim 4, wherein the plurality of entries in the content addressable memory are bounded by a minimum index identifier (INDEXMIN) and a maximum index identifier (INDEXMAX), wherein the plurality of entries in the content addressable memory comprise a plurality of free space entries each having an unused prefix field and an unused prefix length field, wherein the plurality of free space entries are located in a middle portion of the content addressable memory bounded by a low free space index identifier (FREELOW) and a high free space index identifier (FREEHIGH), wherein entries in the content addressable memory having prefixes with prefix lengths that are greater than a threshold prefix length (THRESHOLD) have associated index identifiers that are greater than or equal to INDEXMIN and less than FREELOW, and wherein entries in the content addressable memory having prefixes with prefix lengths that are less than or equal to THRESHOLD have associated index identifiers that are greater than FREEHIGH and less than INDEXMAX.

10. The method as defined in claim 9, wherein the step of determining the third index identifier comprises the step of:

identifying FREELOW as the third index identifier associated with the third entry where the third prefix with the third prefix length may be added to the content addressable memory if:

the first set of index identifiers is empty;

the smallest index in the second set of index identifiers is equal to INDEXMAX; and the third prefix length is greater than THRESHOLD.

11. The method as defined in claim 9, wherein the step of determining the third index identifier comprises the step of:

identifying FREEHIGH as the third index identifier associated with the third entry where the third prefix with the third prefix length may be added to the content addressable memory if:

the first set of index identifiers is empty;

the smallest index in the second set of index identifiers is equal to INDEXMAX; and the third prefix length is less than or equal to THRESHOLD.

12. The method as defined in claim 9, wherein the step of determining the third index identifier comprises the step of:
identifying FREELOW as the third index identifier associated with the third entry where the third prefix with the third prefix length may be added to the content addressable memory if:
the first set of index identifiers is empty;
the smallest index in the second set of index identifiers is less than INDEXMAX;
the length of the prefix in the entry associated with the smallest index in the second set of index identifiers is less than or equal to THRESHOLD; and
the third prefix length is greater than THRESHOLD.

13. The method as defined in claim 9, wherein the step of determining the third index identifier comprises the step of:
identifying FREEHIGH as the third index identifier associated with the third entry where the third prefix with the third prefix length may be added to the content addressable memory if:
the first set of index identifiers is empty;
the smallest index in the second set of index identifiers is less than INDEXMAX;
the length of the prefix in the entry associated with the smallest index in the second set of index identifiers is less than or equal to THRESHOLD; and
the third prefix length is less than or equal to THRESHOLD.

14. The method as defined in claim 9, wherein the step of determining the third index identifier comprises the step of:
identifying the smallest index in the second set of index identifiers as the third index identifier associated with the third entry where the third prefix with the third prefix length may be added to the content addressable memory if:
the first set of index identifiers is empty;
the smallest index in the second set of index identifiers is less than INDEXMAX; and
the length of the prefix in the entry associated with the smallest index in the second set of index identifiers is greater than THRESHOLD.

15. The method as defined in claim 9, wherein the step of determining the third index identifier comprises the step of:
identifying the largest index in the first set of index identifiers as the third index identifier associated with the third entry where the third prefix with the third prefix length may be added to the content addressable memory if:
the first set of index identifiers is not empty;
the smallest index in the second set of index identifiers is equal to INDEXMAX; and
the length of the prefix in the entry associated with the largest index in the first set of index identifiers is less than or equal to THRESHOLD.

16. The method as defined in claim 9, wherein the step of determining the third index identifier comprises the step of:
identifying FREEHIGH as the third index identifier associated with the third entry where the third prefix with the third prefix length may be added to the content addressable memory if:
the first set of index identifiers is not empty;
the smallest index in the second set of index identifiers is equal to INDEXMAX;
the length of the prefix in the entry associated with the largest index in the first set of index identifiers is greater than THRESHOLD; and
the third prefix length is less than or equal to THRESHOLD.

17. The method as defined in claim 9, wherein the step of determining the third index identifier comprises the step of:
identifying FREELOW as the third index identifier associated with the third entry where the third prefix with the third prefix length may be added to the content addressable memory if:
the first set of index identifiers is not empty;
the smallest index in the second set of index identifiers is equal to INDEXMAX;
the length of the prefix in the entry associated with the largest index in the first set of index identifiers is greater than THRESHOLD; and
the third prefix length is greater than THRESHOLD.

18. The method as defined in claim 9, wherein the step of determining the third index identifier comprises the step of:
identifying the largest index in the first set of index identifiers as the third index identifier associated with the third entry where the third prefix with the third prefix length may be added to the content addressable memory if:
the first set of index identifiers is not empty;
the smallest index in the second set of index identifiers is less than INDEXMAX;
the length of the prefix in the entry associated with the smallest index in the second set of index identifiers is less than or equal to THRESHOLD; and
the length of the prefix in the entry associated with the largest index in the first set of index identifiers is less than or equal to THRESHOLD.

19. The method as defined in claim 9, wherein the step of determining the third index identifier comprises the step of:
identifying FREEHIGH as the third index identifier associated with the third entry where the third prefix with the third prefix length may be added to the content addressable memory if:
the first set of index identifiers is not empty;
the smallest index in the second set of index identifiers is less than INDEXMAX;
the length of the prefix in the entry associated with the smallest index in the second set of index identifiers is less than or equal to THRESHOLD;
the length of the prefix in the entry associated with the largest index in the first set of index identifiers is greater than THRESHOLD; and
the third prefix length is less than or equal to THRESHOLD.

20. The method as defined in claim 9, wherein the step of determining the third index identifier comprises the step of:
identifying FREELOW as the third index identifier associated with the third entry where the third prefix with the third prefix length may be added to the content addressable memory if:
the first set of index identifiers is not empty;
the smallest index in the second set of index identifiers is less than INDEXMAX;
the length of the prefix in the entry associated with the smallest index in the second set of index identifiers is less than or equal to THRESHOLD;
the length of the prefix in the entry associated with the largest index in the first set of index identifiers is greater than THRESHOLD; and
the third prefix length is greater than THRESHOLD.

21. The method as defined in claim 9, wherein the step of determining the third index identifier comprises the step of:
identifying the smallest index in the second set of index identifiers as the third index identifier associated with the third entry where the third prefix with the third prefix length may be added to the content addressable memory if:
the first set of index identifiers is not empty;
the smallest index in the second set of index identifiers is less than INDEXMAX;
the length of the prefix in the entry associated with the smallest index in the second set of index identifiers is greater than THRESHOLD; and
the length of the prefix in the entry associated with the largest index in the first set of index identifiers is greater than THRESHOLD.

22. The method as defined in claim 9, further comprising the step of:
adding the third prefix with the third prefix length in the third entry associated with the third index identifier.

23. The method as defined in claim 9, further comprising the step of:
moving up a subset of entries of one of the first set of entries and the second set of entries to create the third entry into which the third prefix with the third prefix length may be added if the third index identifier is determined to be less than FREELOW.

24. The method as defined in claim 23, further comprising the step of:
incrementing FREELOW by one if the third index identifier is determined to be less than FREELOW.

25. The method as defined in claim 9, further comprising the step of:
moving down a subset of entries of one of the first set of entries and the second set of entries to create the third entry into which the third prefix with the third prefix length may be added if the third index identifier is determined to be greater than FREEHIGH.

26. The method as defined in claim 25, further comprising the step of:
decrementing FREEHIGH by one if the third index identifier is determined to be greater than FREEHIGH.

27. The method as defined in claim 9, further comprising the step of:
deleting a fourth prefix with a fourth prefix length from a fourth entry having an associated fourth index identifier.

28. The method as defined in claim 27, wherein each of the plurality of entries also has a free space indicator, further comprising the step of:
setting the free space indicator in the fourth entry.

29. The method as defined in claim 27, further comprising the step of:
moving a block of entries down by one from the plurality of free space entries into the fourth entry if the fourth index identifier is less than FREELOW.

30. The method as defined in claim 29, further comprising the step of:
decrementing FREELOW by one if the fourth index identifier is less than FREELOW.

31. The method as defined in claim 30, wherein each of the plurality of entries also has a free space indicator, further comprising the step of:
setting the free space indicator in the entry associated with index identifier FREELOW−1 after decrementing FREELOW by one.

32. The method as defined in claim 27, further comprising the step of:
moving a block of entries up by one from the plurality of free space entries into the fourth entry if the fourth index identifier is greater than FREEHIGH.

33. The method as defined in claim 32, further comprising the step of:
incrementing FREEHIGH by one if the fourth index identifier is greater than FREEHIGH.

34. The method as defined in claim 33, wherein each of the plurality of entries also has a free space indicator, further comprising the step of:
setting the free space indicator in the entry associated with index identifier FREEHIGH+1 after incrementing FREEHIGH by one.

35. A signal embodied in a carrier wave representing one or more sequences of processor readable instructions which, when executed by at least one processor, cause the at least one processor to perform the method recited in claim 1.

36. An apparatus for updating a content addressable memory having a plurality of entries, each of the plurality of entries having a prefix field, a prefix length field, and an associated index identifier, the apparatus comprising:
at least one processor readable media for storing processor readable instructions; and
at least one processor for executing the instructions stored on the at least one processor readable media, thereby causing the at least one processor to:
determine a first set of index identifiers, each index identifier in the first set of index identifiers being associated with a respective entry in a first set of the plurality of entries, each entry in the first set of entries having a respective prefix with a respective prefix length that is greater than a third prefix length of a third prefix to be added to the content addressable memory;
determine a second set of index identifiers, each index identifier in the second set of index identifiers being associated with a respective entry in a second set of the plurality of entries, each entry in the second set of entries having a respective prefix with a respective prefix length that is less than the third prefix length of the third prefix to be added to the content addressable memory; and
determine a third index identifier, based upon the first set of index identifiers and the second set of index identifiers, associated with a third of the plurality of entries where the third prefix with the third prefix length may be added to the content addressable memory, the third index identifier being located in one of or between the first set of index identifiers and the second set of index identifiers.

37. An article of manufacture for updating a content addressable memory having a plurality of entries, each of the plurality of entries having a prefix field, a prefix length field, and an associated index identifier, the article of manufacture comprising:
at least one processor readable carrier; and
instructions carried on the at least one carrier;
wherein the instructions are configured to be readable from the at least one carrier by at least one processor and thereby cause the at least one processor to operate so as to:
determine a first set of index identifiers, each index identifier in the first set of index identifiers being associated with a respective entry in a first set of the plurality of entries, each entry in the first set of entries having a respective prefix with a respective prefix length that is greater than a third prefix length of a third prefix to be added to the content addressable memory;
determine a second set of index identifiers, each index identifier in the second set of index identifiers being associated with a respective entry in a second set of the plurality of entries, each entry in the second set of entries having a respective prefix with a respective prefix length that is less than the third prefix length of the third prefix to be added to the content addressable memory; and determine a third index identifier, based upon the first set of index identifiers and the second set of index identifiers, associated with a third of the plurality of entries where the third prefix with the third prefix length may be added to the content addressable memory, the third index identifier being located in one of or between the first set of index identifiers and the second set of index identifiers.

* * * * *